(12) United States Patent
Meyer et al.

(10) Patent No.: US 10,904,404 B2
(45) Date of Patent: Jan. 26, 2021

(54) LASER CONTROL IN SCANNERS

(71) Applicant: Hewlett-Packard Development Company, L.P., Spring, TX (US)

(72) Inventors: Bill Meyer, San Diego, CA (US); Matthew G. Lopez, San Diego, CA (US)

(73) Assignee: Hewlett-Packard Development Company. L.P., Spring, TX (US)

( * ) Notice: Subject to any disclaimer, the term of this patent is extended or adjusted under 35 U.S.C. 154(b) by 0 days.

(21) Appl. No.: 16/615,798

(22) PCT Filed: Jul. 20, 2017

(86) PCT No.: PCT/US2017/043071
§ 371 (c)(1),
(2) Date: Nov. 21, 2019

(87) PCT Pub. No.: WO2019/017954
PCT Pub. Date: Jan. 24, 2019

(65) Prior Publication Data
US 2020/0137257 A1    Apr. 30, 2020

(51) Int. Cl.
*H04N 1/028* (2006.01)
*H04N 1/053* (2006.01)

(52) U.S. Cl.
CPC ........... *H04N 1/0282* (2013.01); *H04N 1/053* (2013.01)

(58) Field of Classification Search
None
See application file for complete search history.

(56) References Cited

U.S. PATENT DOCUMENTS

| | | | |
|---|---|---|---|
| 3,488,756 A | 1/1970 | Skrivanek, Jr. | |
| 4,542,986 A | 9/1985 | Berdanier | |
| 5,068,529 A | 11/1991 | Ogino et al. | |
| 5,130,525 A * | 7/1992 | Ryon | H04N 1/0473 250/208.1 |
| 5,262,613 A | 11/1993 | Norris et al. | |
| 5,418,608 A * | 5/1995 | Caimi | G01S 17/89 348/139 |
| 7,324,132 B2 * | 1/2008 | Said | H04N 13/211 348/146 |
| 7,593,605 B2 * | 9/2009 | King | G06K 9/00 382/313 |

(Continued)

FOREIGN PATENT DOCUMENTS

JP    2004094174    3/2004

OTHER PUBLICATIONS

A. Al-Dawji, et al., A Study on Encoded Laser Beams Scanning Type Signal Field, Aug. 4-6, 2004 <http://ieeexplore.ieee.org/abstract/document/1491429/ >.

(Continued)

*Primary Examiner* — Anh-Vinh T Nguyen
(74) *Attorney, Agent, or Firm* — Rahman LLC (US LC)

(57) ABSTRACT

An example device including a laser source for generating a laser pulse, a scanner for mounting the laser source, and a motion detector for detecting a motion of the scanner when the laser pulse scans an object. The motion detector includes an optical sensor for generating an optical signal based on the motion of the scanner, and a controller. The controller determines a movement of the scanner and disables the laser source when the scanner ceases to move.

20 Claims, 7 Drawing Sheets

(56) References Cited

U.S. PATENT DOCUMENTS

| | | | |
|---|---|---|---|
| 8,013,983 B2 | 9/2011 | Lin et al. | |
| 8,157,387 B2 | 4/2012 | Yonekubo et al. | |
| 8,179,563 B2* | 5/2012 | King | G06K 9/24 358/1.6 |
| 10,075,602 B2* | 9/2018 | Gine Leon | H04N 1/00694 |
| 2002/0170893 A1 | 11/2002 | Rohleder et al. | |
| 2003/0142288 A1 | 7/2003 | Kinrot et al. | |
| 2004/0181148 A1* | 9/2004 | Uchiyama | A61B 1/0008 600/425 |
| 2007/0165208 A1* | 7/2007 | Cowburn | G03G 21/046 356/71 |
| 2007/0171220 A1* | 7/2007 | Kriveshko | A61C 9/0046 345/419 |
| 2008/0317077 A1 | 12/2008 | Hoving et al. | |
| 2009/0032706 A1* | 2/2009 | Prater | G01Q 20/02 250/307 |
| 2009/0116091 A1* | 5/2009 | Overmann | G01J 1/4228 359/212.1 |
| 2014/0120981 A1* | 5/2014 | King | G06F 16/58 455/556.1 |
| 2014/0179370 A1* | 6/2014 | Dave | H04N 1/107 455/556.1 |
| 2018/0321658 A1* | 11/2018 | Whitmarsh | B33Y 50/00 |
| 2019/0064889 A1* | 2/2019 | Wong | G06F 1/1654 |
| 2019/0268072 A1* | 8/2019 | Aoyama | H04B 10/1141 |
| 2020/0285047 A1* | 9/2020 | Pu | G02B 26/0841 |

OTHER PUBLICATIONS

Epilog Laster, Linear Encoder Positioning <https://www.epiloglaser.com/products/legend-laser/legend-linear-encoders.htm>.

* cited by examiner

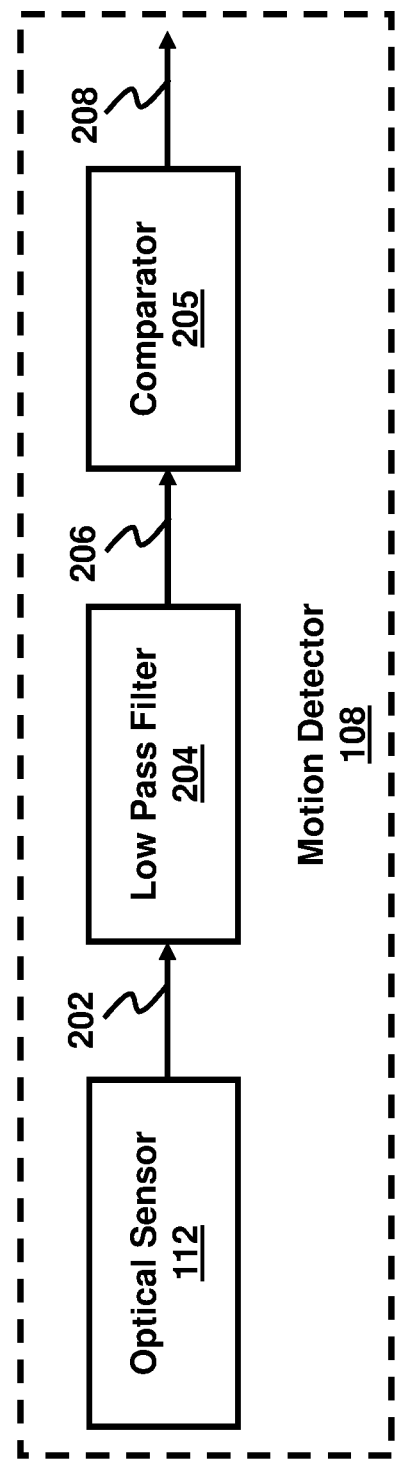

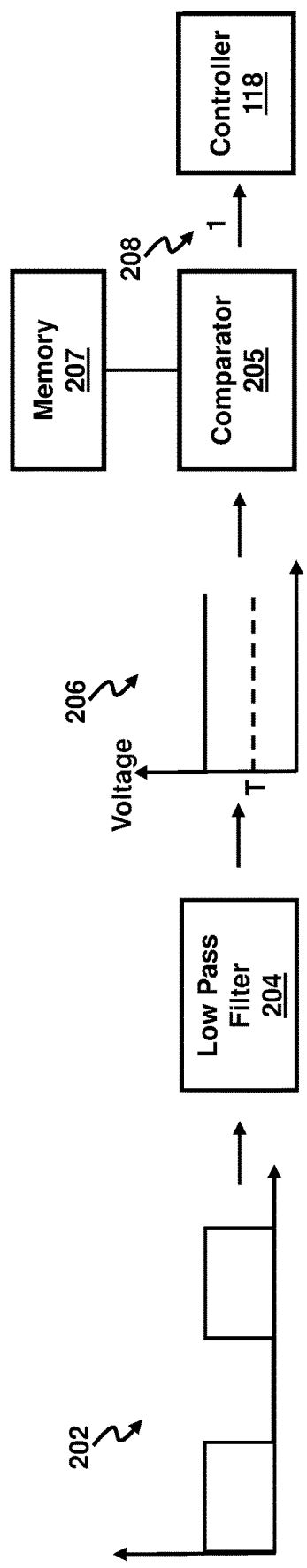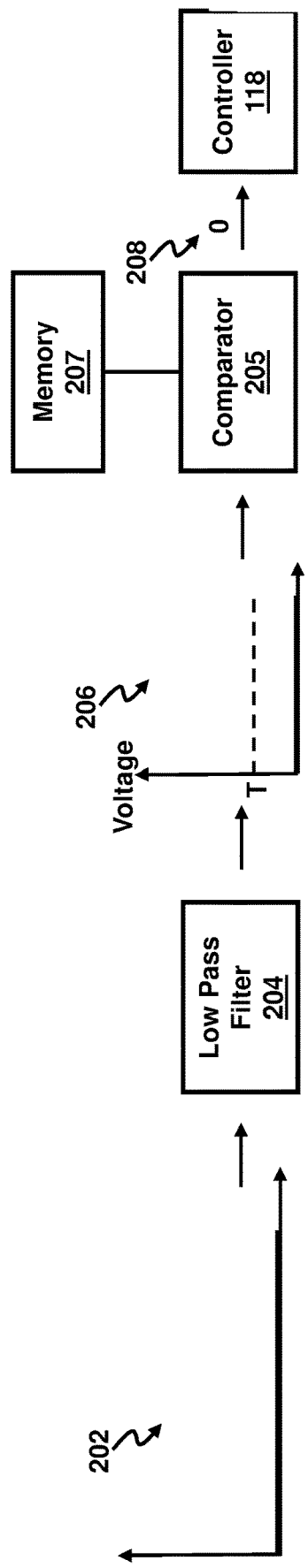
FIG. 3A
FIG. 3B

LASER CONTROL IN SCANNERS

BACKGROUND

Scanners may use a laser beam to scan an object. For example, a flatbed scanner may use a laser beam to scan a sheet of paper placed over the flatbed scanner. Scanner operators often avert their eyes from the laser beams for safety reasons.

BRIEF DESCRIPTION OF THE DRAWINGS

FIG. 2 is a schematic diagram illustrating a motion detector used in a scanner, according to an example.

FIG. 3A is a schematic diagram illustrating signals generated for motion detection in a scanner, according to an example.

FIG. 3B is a schematic diagram illustrating signals generated for motion detection in a scanner, according to another example.

DETAILED DESCRIPTION

Scanners may be used to scan a three-dimensional (3D) image of a 3D object. Laser beams may be used in scanning 3D objects. However, laser beams may be detrimental to the human eye. Specifically, direct exposure to laser beams may damage the cornea or retina of the eye. Therefore, safety mechanisms are used to reduce harmful exposure of the eye to the laser beams. The examples described herein provide new mechanisms to control and reduce harmful exposure of the laser beam used in scanners to the human eye. When a source of the laser beam is not in motion, it poses more danger for the eye. Examples herein provide systems and methods to disable the laser source when it is not moving, thereby reducing the likeliness of damaging a user's eye.

Figure 1A:
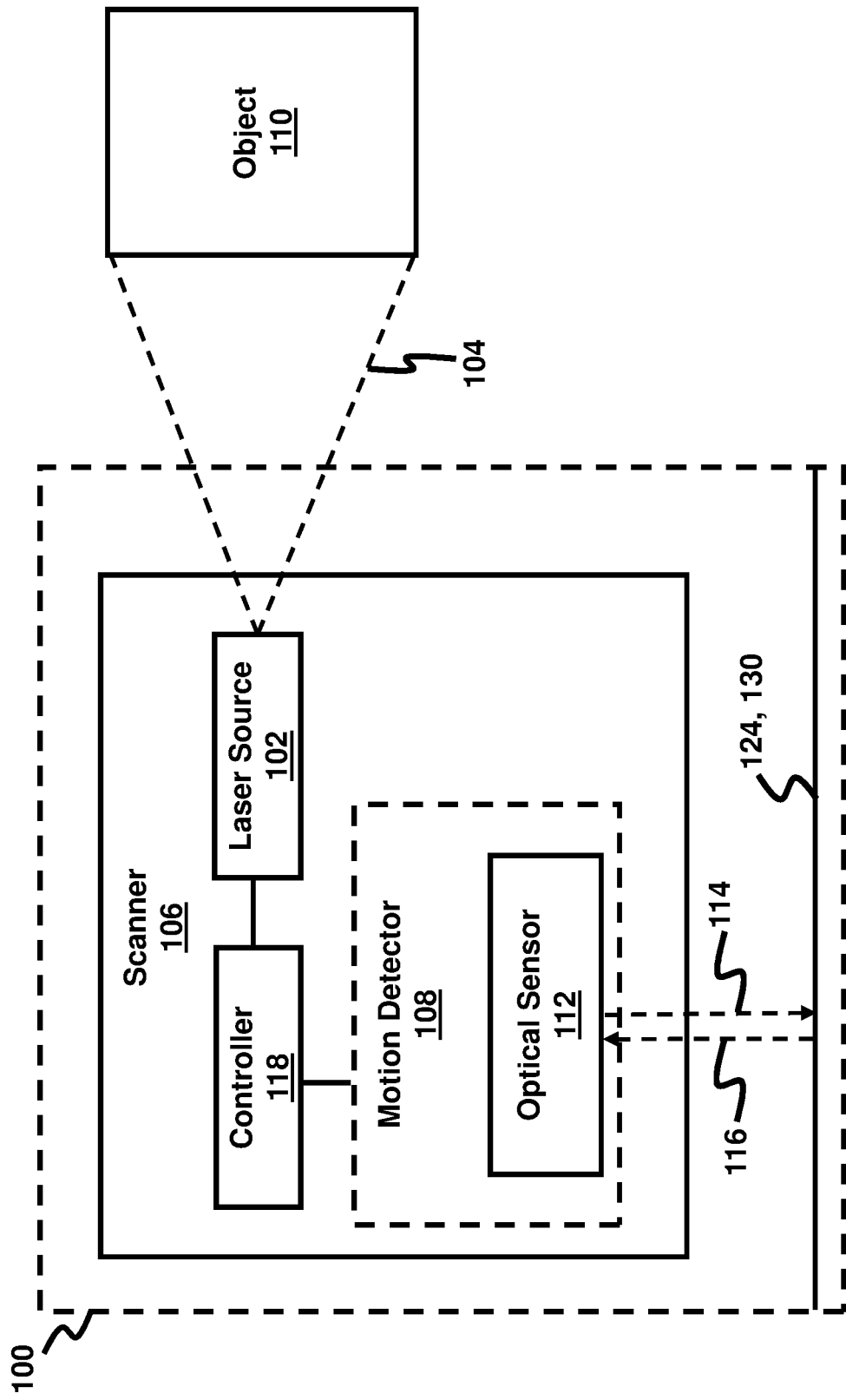
FIG. 1A is a schematic diagram illustrating a device for scanning an object according to an example.

FIG. 1A is a schematic diagram illustrating an electronic device 100 according to an example. The device 100 comprises a laser source 102 to generate a laser pulse 104. The laser source 102 may be carriage mounted in the device 100, according to one example. The device 100 comprises a scanner 106 connected to the laser source 102. The scanner 106 may be any type of scanner using laser pulses directed to an object 110 to be scanned. Furthermore, the device 100 comprises a motion detector 108 to detect a motion of the scanner 106 when the laser pulse scans an object 110. The motion detector 108 comprises an optical sensor 112 to generate a first optical signal 114 and receive a second optical signal 116 from an encoder 124, 130 based on the motion of the scanner 106. Moreover, the motion detector 108 may be any suitable type of device used to detect motion. For example, the motion detector 108 may include microwave motion detectors, area reflective motion detectors, vibration detectors, among other types of devices described below, and may be wireless or hardwired with respect to the device 100. A controller 118 is communicatively coupled to the motion detector 108 to disable the laser source 102 when the scanner 106 ceases to move.

The motion detector 108 communicates to a controller 118 information about movement of the scanner 106 based on the second optical signal 116. In one example, the controller 118 may comprise a microcontroller, which may be embedded in the device 100, and which may be self-programmable, and may store firmware. The controller 118 disables the laser source 102 when the scanner 106 ceases to move. According to an example, the controller 118 may receive a signal from the motion detector 108 indicating a lack of motion from the scanner 106, and then the controller 118 may transmit a corresponding signal to the laser source 102 to turn-off the laser source 102. In this regard, the laser source 102 may comprise a switch or other similar device, not shown, for turning on/off the laser source 102.

Figure 1C:
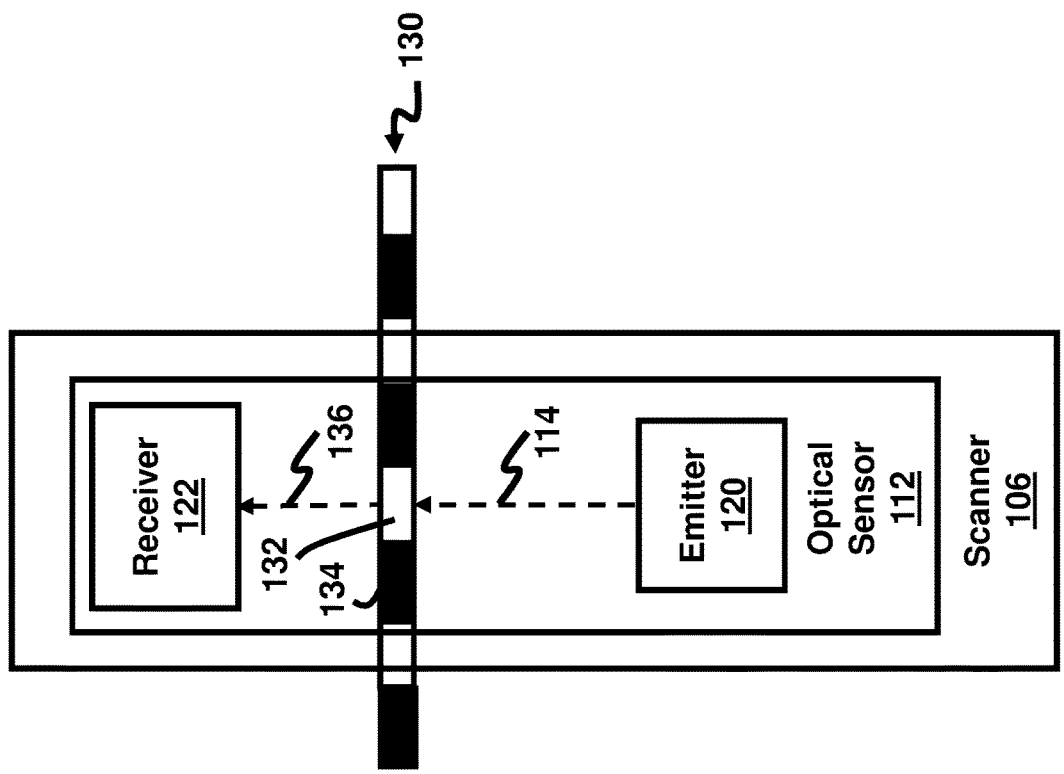
FIG. 1C is a schematic diagram illustrating a transmission line encoder, according to an example.
Figure 1B:
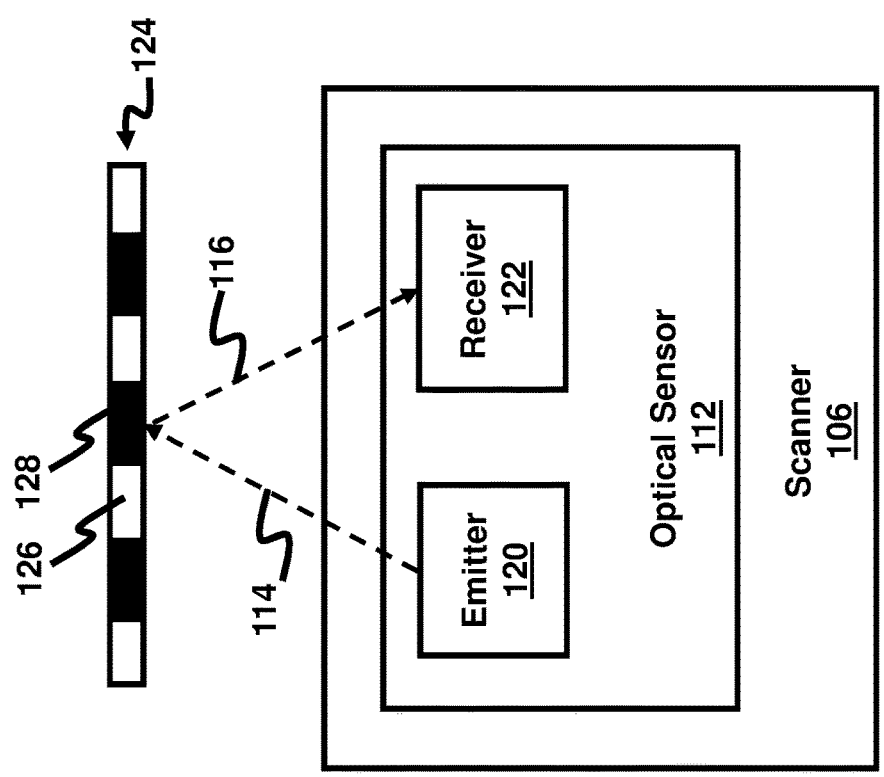
FIG. 1B is a schematic diagram illustrating a reflective line encoder, according to an example.

FIG. 1B, with reference to FIG. 1A, is a schematic diagram illustrating a reflective line encoder 124, which is used with the motion detector 108, for detecting motion of the scanner 106, according to an example. The line encoder 124 may comprise a single quadrature encoder and an encoder strip, in an example. The optical sensor 112 may comprise an emitter 120 and a receiver 122 positioned on the same side of the reflective line encoder 124. The emitter 120 may continuously generate the first optical signal 114, transmitted towards the line encoder 124. The line encoder 124 may comprise substantially reflective sections 128, shown as solid sections in FIG. 1B, intermitted with substantially non-reflective sections 126, shown as hollow sections in FIG. 1B. When the scanner 106 moves, it causes the optical sensor 112 to move also. The movement of the optical sensor 112 may cause the receiver 122 to receive a second optical signal 116. By receiving the second optical signal 116, the optical sensor 112 may generate a periodical electric pulse as described with reference to FIG. 3A below.

FIG. 1C, with reference to FIGS. 1A and 1B, is a schematic diagram illustrating a transmission line encoder 130, which is used with the motion detector 108, for detecting motion of the scanner 106, according to an example. The optical sensor 112 may comprise the emitter 120 and the receiver 122 positioned on opposite sides of the transmission line encoder 130. The emitter 120 may continuously generate the first optical signal 114, which is transmitted towards the line encoder 130. The line encoder 130 may comprise substantially opaque sections 134, shown as solid sections in FIG. 1C, intermitted with substantially transparent sections 132, shown as hollow sections in FIG. 1C. When the scanner 106 moves, it causes the optical sensor 112 to move also. The movement of the optical sensor 112 may cause the receiver 122 to receive a second optical signal 136. By receiving the second optical signal 136, the optical sensor 112 may generate a periodical electric pulse as described with reference to FIG. 3A below. Accordingly, FIGS. 1B and 10 illustrate two alternative examples of line encoders 124, 130 which may be used for detecting motion of the scanner 106 of device 100 of FIG. 1A.

FIG. 2, with reference to FIGS. 1A through 10, is a schematic diagram illustrating the motion detector 108, according to an example. The optical sensor 112 may generate an output 202, which may be an output signal or electrical pulses, for example. The output 202 may comprise a signal such as an electrical pulse series when the scanner 106 moves. The optical sensor 112 may cease to generate the electrical pulse series in the output 202 when the scanner 106 ceases to move. In this regard, the optical sensor 112 may have a switch or other similar device, not shown, to trigger the on/off generation of the electrical pulse series.

The motion detector 108 may utilize filtering techniques to control the electrical pulse series in the output 202. For example, the motion detector 108 may comprise a low pass filter 204 to filter the electrical pulse series in the output 202. The low pass filter 204 may be pre-programmed to different output levels corresponding to different output signals, which are aligned to the motion or non-motion of the scanner 106. In an example, an output 206 of the low pass filter is at a first level of output, for example a zero voltage level, when the scanner 106 ceases to move, and the output of 206 is at a second level of output, for example a non-zero voltage level, when the scanner 106 moves. The output 206 may be an output signal or electrical pulses, for example. Other filtering techniques may also be utilized in accordance with other examples herein.

In an example, the motion detector 108 comprises a comparator 205 to compare the output 206 of the low pass filter 204 with a threshold level and generate an output 208. In an example, the comparator 205 compares the voltage level associated with output 206 with a predetermined threshold voltage level to generate the output 208. The output 208 may comprise a digital signal having a digital value comprising a value 0 and a value 1. The comparator 205 may be controlled, if necessary, for hysteresis purposes based on the voltage levels that are being output 206 from the low pass filter 204 in order to compensate for noise.

FIG. 3A, with reference to FIGS. 1A through 2, is a schematic diagram illustrating the signals in the motion detector 108 when the scanner 106 is moving, according to an example. When the scanner 106 moves, the output 202 generated by the optical sensor 112 comprises a non-zero electrical pulse, for example. The output 202 may be a fifty percent duty cycle square wave, according to an example. When the low pass filter 204 receives the non-zero output 202 as an input, the low pass filter 204 generates the non-zero output 206.

The comparator 205 compares the output 206 with a threshold voltage value T. If the output 206 is greater than the threshold voltage value T, the output 208 of comparator 205 has a digital value 1. When the controller 118 receives the digital value 1 from the comparator 205, the controller 118 continues to keep the laser source 102 enabled; e.g., the controller 118 keeps the laser source 102 on or turns the laser source 102 on if the laser source 102 is currently off. In one example, the threshold voltage value T is stored in memory 207 for retrieval and input into the comparator 205. In another example, the comparator 205 is pre-programmed with the threshold voltage value T. The threshold voltage value T may be changed periodically depending on the application of the scanner 106 including the size of the object 110 to be scanned, or for calibration purposes to ensure that the controller 118 is transmitting a proper signal to the laser source 102 to turn on/off the laser source 102.

FIG. 3B, with reference to FIGS. 1A through 3A, is a schematic diagram illustrating the signals in the motion detector 108 when the scanner 106 ceases to move, according to an example. When the scanner 106 ceases to move, the output 202 generated by the optical sensor 112 comprise an electrical pulse with approximately a zero value. When the low pass filter 204 receives the near zero value output 202 as an input, it generates a corresponding near zero output 206. The comparator 205 compares the output 206 with a threshold voltage value T. Again, the threshold voltage value T may be stored in memory 207 or the comparator 205 may be suitably pre-programmed, as described above. If the output 206 is less than the threshold voltage value T, the output 208 of comparator 205 has a digital value 0. When the controller 118 receives the digital value 0 from the comparator 205, the controller 118 disables the laser source 102; e.g., turns the laser source 102 off or keeps the laser source off 102 if the laser source 102 is currently off.

In an example, by detecting the motion of the scanner 106, the motion detector 108 enables; e.g., turns on, the laser source 102 only when the scanner 106 is in motion, and disables; e.g., turns off, the laser source 102 when the scanner 106 ceases to move. By doing so, the device 100 reduces the risk of prolonged and harmful exposure of the laser pulse 104 to a user's eye.

In an example, the scanner 106 scans the object 110 in three dimensions using the laser pulse 104. The device 100 may have application in the medical field; e.g., podiatry, for example. Accordingly, the scanner 106 may be a foot scanner that includes a multi-camera system; e.g., nine cameras, and line lasers, in an example. The object 110 may be a patient's foot and the scanner 106 may scan the patient's foot in three dimensions for create a computer model, diagnosis, or treatment purposes. In order to prevent prolonged and harmful exposure of the laser pulse 104 to the patient's eyes or the medical operator's eyes, the device 100 may be utilized to control turning on/off the laser source 102 if the motion detector 108 detects that the scanner 106 is not currently in motion.

Figure 4:
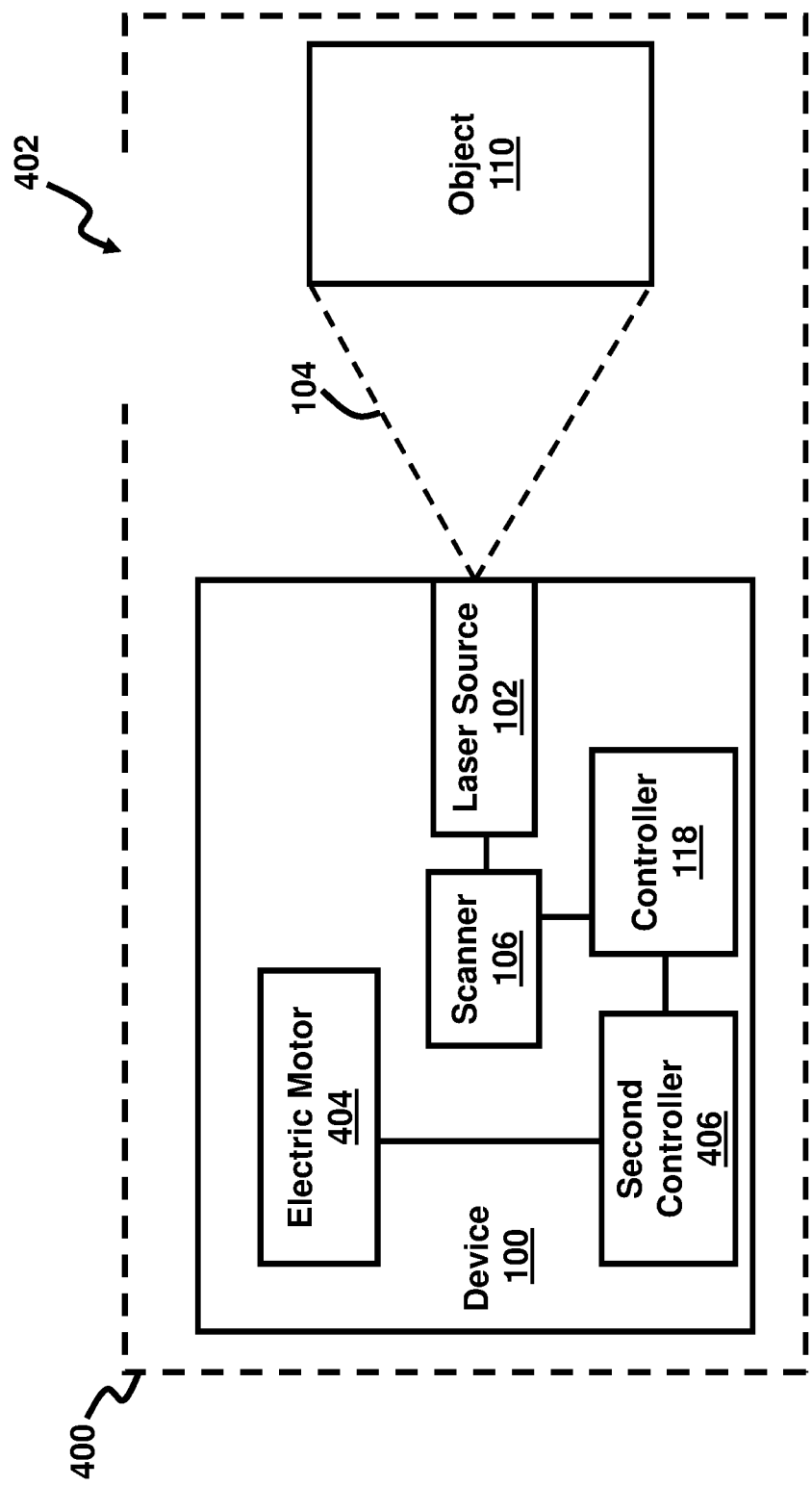
FIG. 4 is a schematic diagram illustrating a chamber for holding a scanner, according to an example.

FIG. 4, with reference to FIGS. 1A through 3B, is a schematic diagram illustrating a chamber 400 that encloses the device 100, according to an example. The chamber 400 may comprise an opening 402 to receive the object 110 to be scanned. Again, in one example, the object 110 may be a patient's foot, and the opening 402 may be a door or flap, etc. to allow the patient to insert his/her foot in the chamber 400 in order for the device 100 to begin scanning. While the chamber 400 may provide shielding of the laser pulse 104, depending on the energy of the laser pulse 104 the chamber 400 may not provide adequate shielding. Accordingly, the motion sensing and on/off control of the laser source 102 remains practical in the configuration utilizing the chamber 400.

In an example, the device 100 may also comprise an electric motor 404 or other suitable machine to move the scanner 106 in such a way so as to scan the object 110 in three dimensions using the laser pulse 104. The electric motor 404 may be controlled using a second controller 406. According to an example, the second controller 406 may comprise a microcontroller, which may be embedded in the device 100, and which may be self-programmable, and may store firmware.

The second controller 406 may be communicatively coupled to controller 118. In an example, the second controller 406 may transmit a signal to controller 118 in order to inform the controller 118 when the electric motor 404 ceases to move. Using the information received from the second controller 406 about the movement or non-movement of the electric motor 404, and therefore the corresponding movement or non-movement of the scanner 106, the controller 118 may disable; e.g., turn off, the laser source 102 when the scanner 106 ceases to move.

Various examples described herein may include both hardware and software elements. The examples that are implemented in software may include firmware, resident software, microcode, etc. Other examples may comprise a computer program product configured to include a pre-configured set of instructions, which when performed, may result in actions as stated in conjunction with the methods described above. In an example, the pre-configured set of instructions may be stored on a tangible non-transitory computer readable medium or a program storage device containing software code.

Figure 5A:
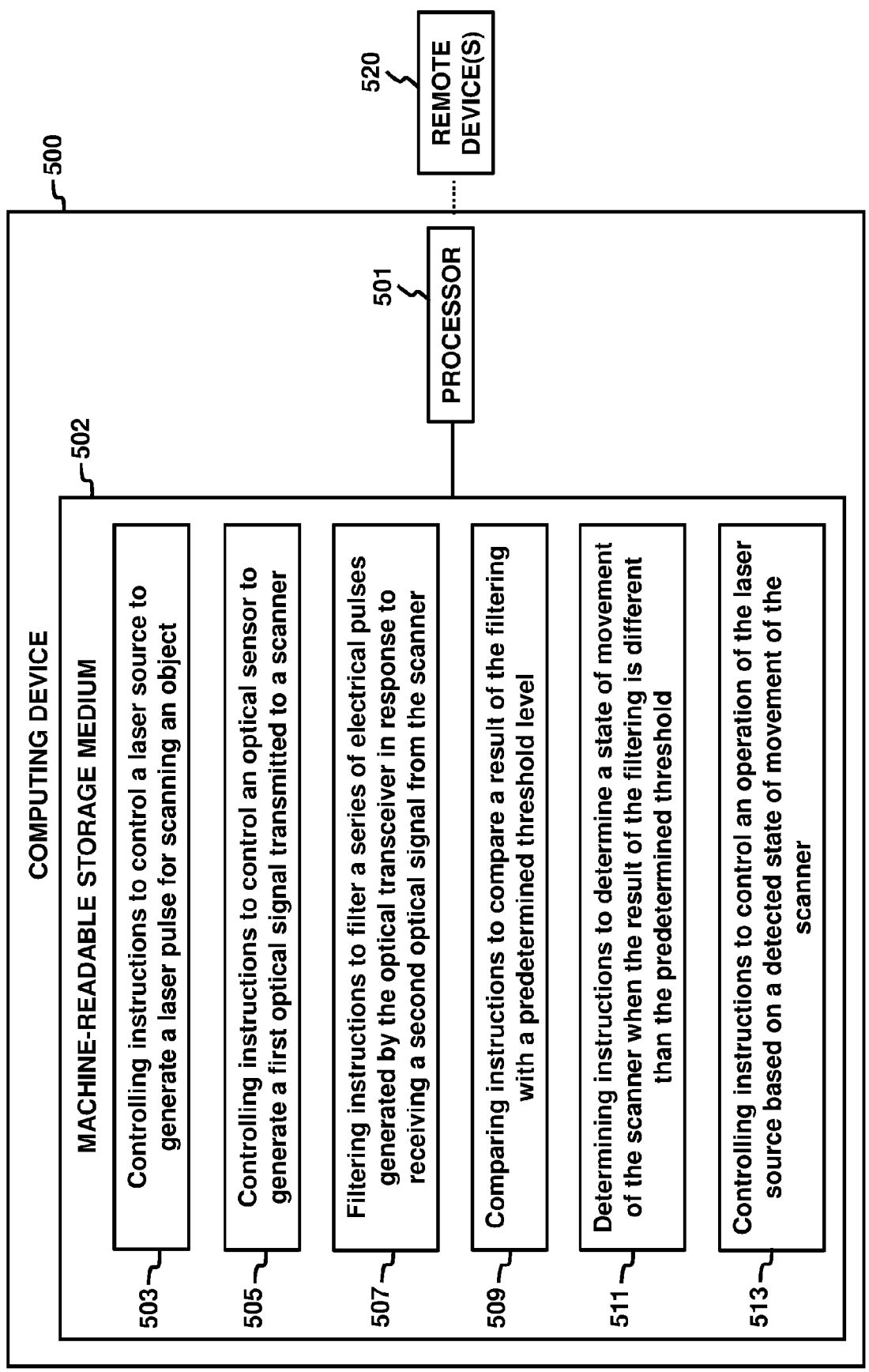
FIG. 5A is a system block diagram for controlling operation of a laser source, according to an example.
Figure 5B:
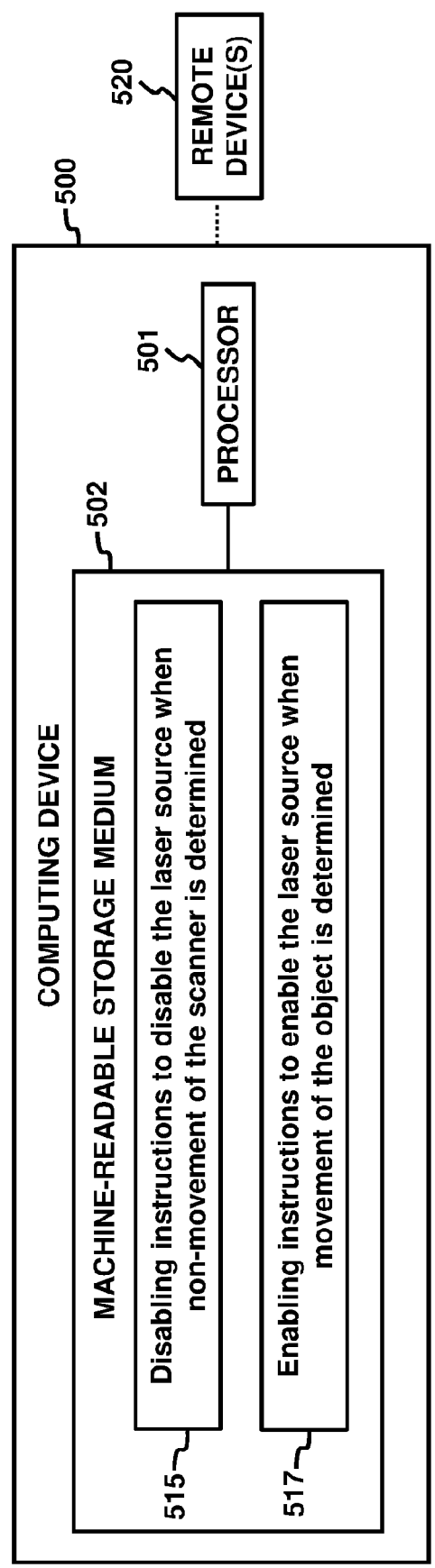
FIG. 5B is a system block diagram for controlling operation of a laser source, according to another example.

FIGS. 5A and 5B, with reference to FIGS. 1A through 4, are block diagrams of an example computing device 500 for controlling the movement of the scanner 106 that is mechanically coupled to the laser source 102 to create the laser pulse 104. The computing device 500 may be a computing device including the electronic device 100 of FIGS. 1A and 4. In the example of FIGS. 5A and 5B, the computing device 500 includes a processor 501 and a machine-readable storage medium 502.

Processor 110 may include a central processing unit (CPU), microprocessors, and/or other hardware devices suitable for retrieval and execution of instructions stored in machine-readable storage medium 502. Processor 501 may fetch, decode, and execute computer-executable instructions 503, 505, 507, 509, 511, 513 to enable execution of locally-hosted or remotely-hosted applications for controlling movement of the scanner 106. The remotely-hosted applications may be accessible on one or more remotely-located devices 520, for example. As an alternative or in addition to retrieving and executing instructions, processor 501 may include one or more electronic circuits comprising a number of electronic components for performing the functionality of one or more of instructions 503, 505, 507, 509, 511, 513.

Machine-readable storage medium 502 may be any electronic, magnetic, optical, or other physical storage device that stores executable instructions. Thus, machine-readable storage medium 502 may be, for example, Random Access Memory (RAM), an Electrically-Erasable Programmable Read-Only Memory (EEPROM), a storage drive, an optical disc, and the like. The machine-readable storage medium 502 may be encoded with executable instructions for enabling execution of remotely-hosted applications accessed on the one or more remotely-located devices 520.

Computer-executable controlling instructions 503 may control a laser source 102 to generate a laser pulse 104 for scanning an object 110 in three dimensions, such as described with reference to the device 100 in FIG. 1A. Computer-executable controlling instructions 505 may control an optical sensor 112 to generate a first optical signal 114 transmitted to the scanner 106, as also described with reference to the device 100 in FIG. 1A.

Computer-executable filtering instructions 507 may filter a series of electrical pulses; e.g., output 202, generated by the optical sensor 112 in response to receiving a second optical signal 116 from the scanner 106, as described with reference to the motion detector 108 of FIG. 2. Computer-executable comparing instructions 509 may compare a result of the filtering with a predetermined threshold level T, as described with reference to FIGS. 3A and 3B. Computer-executable determining instructions 511 may determine a state of movement of the scanner 106 when the result of the filtering is different than the predetermined threshold T, in further accordance with FIGS. 1A through 3B. Computer-executable controlling instructions 513 may control an operation of the laser source 102 based on a detected state of movement of the scanner 106, again in further accordance with FIGS. 1A through 3B. In an example, the series of electrical pulses may comprise a fifty percent duty cycle square wave signal.

In an example, controlling the operation of the laser source 102 based on a detected state of movement of the scanner 106 may comprise computer-executable disabling instructions to disable the laser source 102 when non-movement of the scanner 106 is sensed or determined, and computer-executable enabling instructions to enable the laser source 102 when movement of the scanner 106 is sensed or determined, as described above with reference to FIGS. 1A through 4.

The present disclosure has been shown and described with reference to the foregoing exemplary implementations. Although specific examples have been illustrated and described herein it is manifestly intended that the scope of the claimed subject matter be limited only by the following claims and equivalents thereof. It is to be understood, however, that other forms, details, and examples may be made without departing from the spirit and scope of the disclosure that is defined in the following claims.

What is claimed is:

1. A device comprising:
a laser source to generate a laser pulse;
a scanner connected to the laser source;
a motion detector to detect a motion of the scanner when the laser pulse scans an object, wherein the motion detector comprises an optical sensor to generate a first optical signal and receive a second optical signal responsive to the first optical signal from an encoder based on the motion of the scanner; and
a controller communicatively coupled to the motion detector to:
receive an output indication from the motion detector, the output indication having a first value responsive to the second optical signal received by the optical sensor indicating that the scanner has ceased to move, and
disable the laser source responsive to the output indication set to the first value indicating that the scanner has ceased to move.

2. The device of claim 1, wherein the optical sensor is to:
generate an electrical pulse series responsive to the second optical signal from the encoder when the scanner moves; and
cease generating the electrical pulse series when the scanner ceases to move,
wherein the motion detector comprises a low pass filter to filter the electrical pulse series, and
wherein an output of the low pass filter is at a first level when the scanner ceases to move, and at a second level when the scanner moves.

3. The device of claim 2, wherein the controller comprises a comparator to:
compare the output of the low pass filter with a threshold level, and produce the output indication based on the comparison.

4. The device of claim 3, wherein the controller is to disable the laser source responsive to the output of the low pass filter being below the threshold level.

5. The device of claim 3, wherein the controller is to enable the laser source responsive to the output of the low pass filter being above the threshold level.

6. The device of claim 1, wherein the scanner is to scan the object in three dimensions using the laser pulse.

7. The device of claim 1, comprising the encoder, wherein the encoder comprises a series of reflective sections and non-reflective sections, wherein a non-reflective section of the non-reflective sections is between a pair of the reflective sections, and wherein each reflective section is to reflect the first optical signal to produce the second optical signal.

8. The device of claim 1, comprising the encoder, wherein the optical sensor comprises an emitter to emit the first optical signal, and a receiver to receive the second optical signal, and wherein the encoder is positioned between the emitter and the receiver, wherein the encoder comprises a series of opaque sections and transparent sections, wherein a transparent section of the transparent sections is between a pair of the opaque sections, and wherein each opaque section is to block the first optical signal from passing to the receiver, and each transparent section is to allow the first optical signal to pass to the receiver as the second optical signal.

9. The device of claim 1, comprising the encoder, wherein the motion detector and the encoder are moveable relative to one another, and wherein the second optical signal is based on the first optical signal and relative motion of the motion detector and the detector.

10. A device comprising:
a scanner;
a laser source to generate a laser pulse, wherein the laser source is mounted on the scanner;
an optical sensor to:
generate a first optical signal,
receive a second optical signal responsive to the first optical signal from an encoder, and
generate a first output comprising an electrical pulse series responsive to the second optical signal received by the optical sensor when the scanner is moving;
a low pass filter to filter the first output from the optical sensor; and
a first controller to enable or disable the laser source using a second output from the low pass filter based on the filtering of the first output.

11. The device of claim 10, comprising a comparator to:
compare the second output from the low pass filter with a threshold level;
generate a first signal to disable the laser source responsive to the second output being lower than the threshold level; and
generate a second signal to enable the laser source responsive to the second output being greater than the threshold level.

12. The device of claim 11, wherein the first controller is to:
disable the laser source responsive to the first signal; and
enable the laser source responsive to the second signal.

13. The device of claim 11, comprising a chamber to receive an object to be scanned by the scanner, wherein the laser source is to scan the object in three dimensions when the laser source is moving.

14. The device of claim 11, comprising:
an electric motor to move the scanner and the laser source; and
a second controller to control a movement of the scanner and the laser source,
wherein the first controller and the second controller are communicatively coupled together.

15. The device of claim 10, comprising the encoder, wherein the encoder comprises a series of reflective sections and non-reflective sections, wherein a non-reflective section of the non-reflective sections is between a pair of the reflective sections, and wherein each reflective section is to reflect the first optical signal to produce the second optical signal.

16. The device of claim 10, comprising the encoder, wherein the optical sensor comprises an emitter to emit the first optical signal, and a receiver to receive the second optical signal, and wherein the encoder is positioned between the emitter and the receiver, wherein the encoder comprises a series of opaque sections and transparent sections, wherein a transparent section of the transparent sections is between a pair of the opaque sections, and wherein each opaque section is to block the first optical signal from passing to the receiver, and each transparent section is to allow the first optical signal to pass to the receiver as the second optical signal.

17. A non-transitory computer readable medium comprising instructions that when executed cause a controller of an electronic device to:
control a laser source to generate a laser pulse for scanning an object;
control an optical sensor to generate a first optical signal transmitted to a scanner;
filter a series of electrical pulses generated by the optical sensor in response to receiving a second optical signal responsive to the first optical signal from the scanner;
compare a result of the filtering with a predetermined threshold;
determine a state of movement of the scanner based on the companion of the result of the filtering with the predetermined threshold; and
control an operation of the laser source based on the determined state of movement of the scanner.

18. The non-transitory computer readable medium of claim 17, wherein the series of electrical pulses comprises square wave signal.

19. The non-transitory computer readable medium of claim 18, wherein the scanner is to scan the object in three dimensions.

20. The non-transitory computer readable medium of claim 17, wherein the instructions when executed cause the controller to control the operation of the laser source based on the determined state of movement of the scanner by
disabling the laser source when non-movement of the scanner is determined based on the comparison; and
enabling the laser source when movement of the object is determined based on the comparison.

* * * * *